United States Patent [19]

Berner et al.

[11] Patent Number: 4,563,438

[45] Date of Patent: Jan. 7, 1986

[54] LIQUID MIXTURE OF PHOTOINITIATORS

[75] Inventors: Godwin Berner, Rheinfelden; Aloysius H. Manser, Allschwil, both of Switzerland

[73] Assignee: Ciba Geigy Corporation, Ardsley, N.Y.

[21] Appl. No.: 604,296

[22] Filed: Apr. 26, 1984

[30] Foreign Application Priority Data

May 6, 1983 [CH] Switzerland ............... 2492/83

[51] Int. Cl.$^4$ ............................................. C08F 8/00
[52] U.S. Cl. ...................... 502/168; 430/281; 430/922; 430/923; 430/924; 204/159.15; 204/159.22; 502/162; 502/167; 502/172; 522/10
[58] Field of Search ............... 430/281, 922, 923, 924; 204/159.15, 159.22; 502/172, 168, 162, 167

[56] References Cited

U.S. PATENT DOCUMENTS

| | | | |
|---|---|---|---|
| 3,801,329 | 4/1974 | Sandner et al. | 430/923 |
| 3,926,640 | 12/1975 | Rosen | 430/923 |
| 4,008,138 | 2/1977 | Rosen et al. | 430/923 |
| 4,043,887 | 8/1977 | Pacifici et al. | 430/923 |
| 4,067,791 | 1/1978 | Konno et al. | 204/159.15 |
| 4,080,382 | 3/1978 | Pacifici et al. | 430/923 |
| 4,147,604 | 3/1979 | Kuesters et al. | 430/923 |
| 4,199,420 | 3/1980 | Photis | 430/923 |
| 4,284,485 | 8/1981 | Berner | 204/159.15 |
| 4,287,039 | 9/1981 | Buethe et al. | 204/159.19 |
| 4,318,791 | 3/1982 | Felder et al. | 204/159.23 |
| 4,438,100 | 3/1984 | Ishimaru et al. | 430/922 |
| 4,498,964 | 2/1985 | Hüsler et al. | 430/924 |

*Primary Examiner*—Jack P. Brammer
*Attorney, Agent, or Firm*—Harry Falber

[57] ABSTRACT

There are obtained by mixing together approximately equal parts of 1-benzoylcyclohexanol and benzophenone or a benzophenone derivative liquid mixtures which possess a high activity as photoinitiators for the polymerization of ethylenically unsaturated compounds. The level of activity is higher than that of the individual components taken separately.

7 Claims, No Drawings

LIQUID MIXTURE OF PHOTOINITIATORS

The invention relates to a liquid mixture of initiators for the photopolymerisation of ethylenically unsaturated compounds, and to the use thereof for the curing of photopolymerisable compositions.

It is known that photoinitiators are added to the photopolymerisable compositions to accelerate the photocuring of coating compounds, printing inks, photoresists and similar systems. It is possible in this manner to cure such compositions in very short irradiation times to the extent that their surface is no longer tacky. These compositions contain as binders liquid ethylenically unsaturated compounds which, on irradiation with shortwave light, are cured by a radical polymerisation of the unsaturated groups. Various compounds are used as photoinitiators; the majority of them are photochemically cleavable aromatic carbonyl compounds, for example benzoin, benzoin ether, benzil, benzil ketals, benzophenone and derivatives thereof, or thioxanthone and derivatives thereof. There has been found in recent times in specific fields of application a technical use, as photoinitiator, for 1-benzoylcyclohexanol, particularly for photopolymerisable systems based on acrylic acid derivatives. 1-Benzoylcyclohexanol is a crystalline compound melting at 50° C., which is sold commercially under the name of "Irgacure ®184". When it is desired to mix this compound into the mostly oily-liquid or pasty photopolymerisable compositions, a certain time is required until the compound is completely dissolved. The dissolving operation can be accelerated by using the solid photoinitiator in the dissolved form. This necessitates the additional use of a solvent, which has to be removed after application of the composition.

It has now been found that the problem can be solved by mixing the 1-benzoylcyclohexanol with approximately equal parts of benzophenone or a benzophenone derivative which melts below 80° C. These mixtures are liquid within a certain mixing range, and can therefore be quickly incorporated in a simple manner into liquid or pasty compositions. Furthermore, these mixtures are distinguished surprisingly by a high initiator activity. The activity of these mixtures, which can be determined by measurement of the irradiation time necessary to effect curing, is higher than that of the individual components, so that it is possible here to speak of synergism.

The invention relates therefore to a liquid mixture of photoinitiators which consists of 40-60% by weight of 1-benzoylcyclohexanol and 60-40% by weight of benzophenone or of a benzophenone derivative melting below 80° C.

Preferred mixtures are those in the weight ratio of 45-55%:55-45%, especially mixtures in the approximate weight ratio of 50:50%.

Examples of benzophenone derivatives usable according to the invention are:

(a) alkyl derivatives, such as 2-methyl-, 4-methyl-, 2,4-dimethyl-, 3,4-dimethyl-, 4-isopropyl- or 4-dodecyl-benzophenone;

(b) halogen derivatives, particularly chlorine derivatives, such as 2-chloro-, 4-chloro- or 2,2'-dichlorobenzophenone;

(c) alkoxy- and alkylthio derivatives, such as 2-, 3- or 4-methoxy-, 2- or 4-methylthio-, 2-ethoxy-, 4-propoxy-, 4-butoxy- or 4-isopropoxybenzophenone; and (d) carboxylic ester derivatives, such as 2-methoxycarbonyl-, 3-methoxycarbonyl-, 2- or 4-ethoxycarbonyl-, 2- or 4-isopropoxycarbonyl-, 4-tert-butoxycarbonyl-, 2-butoxycarbonyl- or 2,2'-di(ethoxycarbonyl)benzophenone.

Mixtures of 1-benzoylcyclohexanol and benzophenone are preferred.

It is known that benzophenone and benzophenone derivatives are photoinitiators. It was therefore to be expected that for example a mixture of 1-benzoylcyclohexanol and benzophenone would exhibit an initiator activity higher than that of a mixture of 2-benzoylcyclohexanol with some compound that was not a photoinitiator. It was however surprising that the mixtures according to the invention have an initiator activity exceeding that of the individual components taken separately.

The mixtures according to the invention are liquid at room temperature and do not solidify even after prolonged storage. This is demonstrated by the example of mixtures of 1-benzoylcyclohexanol and benzophenone in various weight ratios. The mixtures were stored for 30 days in a refrigerator at 5°–8° C., and were visually examined daily for signs of commencing crystallisation (turbidity). The following results were obtained:

| % by weight of 1-benzoyl-cyclohexanol | % by weight of benzophenone | Crystallisation after |
| --- | --- | --- |
| 95 | 5 | <1 d |
| 90 | 10 | 3 d |
| 80 | 20 | 3 d |
| 70 | 30 | 20 d |
| 65 | 35 | >30 d |
| 60 | 40 | >30 d |
| 55 | 45 | >30 d |
| 50 | 50 | >30 d |
| 45 | 55 | >30 d |
| 40 | 60 | 19 d |
| 30 | 70 | 6 d |
| 20 | 80 | 2 d |
| 10 | 90 | <1 d |

It can be seen from these results that no crystallisation occurs within the mean weight range (65:35 to 45:55%) during the period of observation.

The mixtures according to the invention can contain further additives, provided that the melting point of the mixtures is not appreciably raised as a result. Such additives can be further photoinitiators or curing accelerators; they can be polymerisation inhibitors which increase the stability of the lacquer to storage in the dark; they can be light stabilisers or UV absorbers or flow control auxiliaries, or other additives customarily used in lacquer technology. Of particular importance is the addition of phosphorous acid esters, which act as curing accelerators and antioxidants. Preferred in this respect are liquid phosphites of longer-chain alcohols, especially $C_{10}$–$C_{14}$ alcohols. Examples of these are tridecyl phosphate, tridodecyl phosphate, tri-(isodecyl) phosphate or tri(tetradecyl) phosphate. Also mixed phosphites of 2 or 3 longer-chain alcohols can be used for this purpose.

The amount of phosphite added is preferably 2–10% by weight, relative to the amount of photoinitiators.

The addition of light stabilisers from the series of sterically hindered amines is also of special importance. Liquid compounds are preferred also in this case. Examples of these are bis-(1,2,2,6,6-pentamethyl-4- piperidinyl)sebacate or mixtures thereof with monoethyl-mono(1,2,2-6,6-pentamethyl-1-piperidinyl)-sebacate, such as the commercial product Tinuvin ® 292.

The amount of sterically hindered amine added is preferably 10–20% by weight, relative to the amount of photoinitiators.

The photopolymerisable compositions which can be cured by the use of the initiator mixtures according to the invention contain one or more ethylenically unsaturated compounds. These can be of low molecular weight (monomeric) or of a higher molecular weight (oligomeric), and can contain one or more double bonds.

Examples of monomers containing one double bond are: alkyl acrylates or methacrylates or hydroxyalkyl acrylates or methacrylates, for example methyl, ethyl, butyl, 2-ethylhexyl or 2-hydroxyethyl acrylate, isobornyl acrylate or methyl or ethyl methacrylate. Further examples of the monomers are: acrylonitrile, acrylamide, methacrylamide, N-substituted (meth)acrylamides, vinyl esters, such as vinyl acetate, vinyl ethers, such as isobutyl vinyl ether, styrene, alkylstyrenes and halostyrenes, N-vinyl-pyrrolidone, vinyl chloride or vinylidene chloride.

Examples of monomers containing several double bonds are ethylene glycol diacrylate, propylene glycol diacrylate, neopentylglycol diacrylate, hexamethyleneglycol diacrylate or bisphenol A diacrylate, 4,4'-bis-(2-acryloylethoxy)diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate or tris-(2-acryloyloxyethyl)isocyanurate.

Examples of polyunsaturated compounds of higher molecular weight (oligomers) are acrylated epoxide resins, acrylated polyethers, acrylated polyurethanes or acrylated polyesters. Further examples of unsaturated oligomers are unsaturated polyester resins, which in most cases are prepared from maleic acid, phthalic acid and one or more diols and which have molecular weights of about 500 to 3,000. Unsaturated oligomers of this type can also be designated as prepolymers.

The photopolymerisable compositions can be for example mixtures of a monounsaturated monomer with a polyunsaturated monomer. More frequently, however, mixtures of a polyunsaturated monomer with an unsaturated oligomer (prepolymer) are used. Also three-component mixtures of this type are often used. In this respect the prepolymer primarily determines the properties of the polymer; by varying it those skilled in the art can influence the properties of the cured film. The polyunsaturated monomer functions as a crosslinking agent, which makes the polymer insoluble. The monounsaturated monomer functions as a reactive diluent, by means of which the viscosity is reduced without the necessity of using a solvent.

Two-component and three-component systems of this type based on a prepolymer are used for printing inks as well as for lacquers, photoresists and other photocurable compositions. One-component systems based on photocurable prepolymers are also frequently used as binders for printing inks.

Unsaturated polyester resins are in most cases used in two-component systems together with a monounsaturated monomer, preferably with styrene. Specific one-component systems, for example polymaleimides or polychalcones, are often used for photoresists.

The photopolymerisable compositions can additionally contain small proportions of non-photopolymerisable, film-forming components. These can be, for example, polymers which dry physically, or solutions thereof in organic solvents, for example nitrocellulose or cellulose acetobutyrate. These can, however, also be chemically curable or heat-curable resins, for example polyisocyanates, polyepoxides or melamine resins. The concomitant use of heat-curable resins is important for use in so-called hybrid systems, which are photopolymerised in a first stage and are crosslinked in a second stage by subsequent heat treatment.

The photopolymerisable compositions can contain—depending on the purpose of application—a number of other additives. Examples of these are thermal inhibitors which prevent polymerisation before irradiation and hence are intended to increase storage-stability, curing accelerators, such as tertiary amines, antioxidants, light stabilisers or flow control auxiliaries.

Furthermore, the photopolymerisable compositions can contain fillers, such as silicic acid, talc or gypsum, pigments, dyes or fibres.

The most important fields of application for photopolymerisation are for lacquers and printing inks, for the production of photoresists and for the production of printing plates. The photoinitiator mixtures according to the invention are added to the photopolymerisable compounds in an amount of 0.1 to 20% by weight, in particular 0.5 to 5% by weight.

The photoinitiators according to the invention are of particular importance for their use in clear lacquers, such as for the lacquering of articles made of metal, plastics, wood or paper, since in this case the transparency cannot be lessened by recrystallisation of the inhibitor.

Photopolymerisable lacquers can also be lacquers dilutable with water, such as are described for example in EP No. 12 339 and in the German Offenlegungsschrift No. 3,005,036. Lacquers of this type form a dispersion or emulsion in water. It is an advantage in this case when the added photoinitiator is liquid, since organic liquids can be better dispersed in water than can solids. For this reason, liquid photoinitiators are better than solid ones also for electrically precipitable lacquers, which are of course applied in an aqueous medium.

The addition of the liquid photoinitiator mixtures to the photopolymerisable composition is effected by simply stirring them into the composition. A homogeneous dispersion is obtained in a short time.

The polymerisation of the compositions is performed, using known methods of photopolymerisation, by irradiation with light which is rich in shortwave radiation. Suitable light sources are for example: medium-pressure, high-pressure and low-pressure mercury lamps, and also superactinic fluorescent tubes, the emission maxima of which is within the range of 250 to 400 nm.

It is possible by the addition of photosensitisers to displace the spectral sensitivity into specific ranges, so that it is also possible to operate with relatively long-wave lamps. Examples of such photosensitisers are organic dyes or polynuclear condensed aromatic compounds, for example perylene, anthracene derivatives or thioxanthone derivatives.

The following Examples further illustrate the invention, and show the use of the initiator mixtures according to the invention in various substrates. The term 'parts' denotes parts by weight and percentages are % by weight.

EXAMPLE 1

Curing of a clear lacquer based on acrylate

A solvent-free lacquer having the following recipe is produced:

| | |
|---|---|
| 50 | parts of a urethane acrylate (Ebecryl ® 204, UCB, Belgium), |
| 19 | parts of an epoxide acrylate (XD 4074, Ciba-Geigy, UK), |
| 19 | parts of butanediol diacrylate, |
| 11 | parts of N—vinyl pyrrolidone, |
| 0.5 | part of a flow control auxiliary based on silicone resin (Byk ® 3000, Byk-Mallinckrodt, Fed. Repub. of Germany), and |
| 0.5 | part of a flow control auxiliary (Blisterfree ®, B. Schwegmann, Fed. Repub. of Germany). |

The components are mixed together in a Disolver. There are then added the amounts of photoinitiator shown in the Tables, and mixing is maintained at 50°–60° C. for a further 10–15 minutes.

To determine the rate of curing, the specimens are applied in a film thickness of 60 μm to glass plates, and are then irradiated in a PPG irradiation apparatus with a high-pressure mercury lamp of 80 W/cm. The specimens are passed a number of times through the apparatus until the surface is resistant to wiping. One passage corresponds to an irradiation time of 2.1 seconds: from the number of passages is determined the minimum irradiation time $T_{min}$, which is given in the Table.

In order to verify the through-curing, the pendulum hardness of the specimen cured in the shortest curing time is determined, according to Koenig (DIN 53157), after a storage time of 30 minutes. The results are shown in Table 1.

TABLE 1

| Photo-initiator* | | Phosphite* | Light stabiliser* | $T_{min}$ in sec. | Pendulum hardness (in sec.) |
|---|---|---|---|---|---|
| mixture 1 | 0.5% | — | — | 27.3 | 110 |
| | 1% | — | — | 21.0 | 150 |
| | 2% | — | — | 10.5 | 150 |
| | 5% | — | — | 4.2 | 140 |
| mixture 1 | 0.5% | TDP 0.5% | — | 25.2 | 100 |
| | 1% | " | — | 14.7 | 150 |
| | 2% | " | — | 8.4 | 150 |
| | 5% | " | — | 4.2 | 140 |
| mixture 1 | 0.5% | TDP 0.5% | LS 292 1% | 31.5 | 100 |
| | 1% | " | " | 16.8 | 140 |
| | 2% | " | " | 8.4 | 150 |
| | 5% | " | " | 4.2 | 150 |

*amount in % by weight, relative to the lacquer,
mixture 1 = 50% of 1-benzoylcyclohexanol + 50% of benzophenone,
phosphite: TDP = tridecyl phosphite,
light stabiliser: LS 292 = bis(1,2,2,6,6-pentamethyl-4-piperidyl)-sebacate.

In an analogous manner, white sheets of cardboard are coated with a 7 μm thick film of the samples, and then irradiated until the film is resistant to wiping. The Yellowness Index (YI) of the cured specimens is measured in a Hunter Photometer. The results are listed in Table 2.

TABLE 2

| Photo-initiator | | Phosphite | Light stabiliser | $T_{min}$ in sec. | YI |
|---|---|---|---|---|---|
| mixture 1 | 0.5% | — | — | 31.5 | 11 |
| | 1% | — | — | 29.4 | 10 |
| | 2% | — | — | 14.7 | 11 |
| | 5% | — | — | 6.3 | 10 |
| mixture 1 | 0.5% | TDP 0.5% | — | 29.4 | 11 |
| | 1% | " | — | 23.1 | 10 |
| | 2% | " | — | 12.6 | 10 |
| | 5% | " | — | 6.3 | 11 |
| mixture 1 | 0.5% | TDP 0.5% | LS 292 1% | 31.5 | 9 |
| | 1% | " | " | 29.4 | 9 |
| | 2% | " | " | 16.8 | 9 |
| | 5% | " | " | 6.3 | 9 |

What is claimed is:

1. A liquid mixture of photoinitiators which consists essentially of 40–60% by weight of 1-benzoylcyclohexanol and 60–40% by weight of benzophenone or benzophenone substituted by one or more alkyl, halogen, alkoxy, alkylthio or alkoxycarbonyl groups, the latter substituted compounds melting below 80° C.

2. A mixture according to claim 1, which consists of approximately 50% by weight of 1-benzoylcyclohexanol and approximately 50% by weight of benzophenone or of said substitute benzophenone.

3. A mixture according to claim 1, which consists of 1-benzoylcyclohexanol and benzophenone.

4. A mixture according to claim 1, which additionally contains 2–10% by weight of a phosphorous acid ester 10–20% by weight of a light stabiliser from the series of sterically hindered amines, the % by weight values relating to the total amount of photoinitiators.

5. A mixture according to claim 4 consisting of approximately equal parts by weight of 1-benzoylcyclohexanol and benzophenone or 2-methoxycarbonylbenzophenone and 4–8% by weight of a phosphite of a $C_{10}$–$C_{14}$ alcohol.

6. A mixture according to claim 1, which additionally contains 2–10% by weight of a phosphorous acid ester and 10–20% by weight of a light stabiliser from the series of sterically hindered amines, the % by weight values relating to the total amount of photoinitiators.

7. A mixture according to claim 6, consisting of approximately equal parts by weight of 1-benzoylcyclohexanol and benzophenone or 2-methoxycarbonylbenzophenone and 4–8% by weight of a phosphite of a $C_{10}$–$C_{14}$ alcohol, as well as 10–15% by weight of a liquid light stabiliser from the series of sterically hindered amines.

* * * * *